(12) United States Patent
Long

(10) Patent No.: US 11,764,227 B2
(45) Date of Patent: Sep. 19, 2023

(54) ARRAY SUBSTRATE, DISPLAY PANEL AND DISPLAY DEVICE

(71) Applicant: BOE Technology Group Co., Ltd., Beijing (CN)

(72) Inventor: Chunping Long, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 199 days.

(21) Appl. No.: 16/759,016

(22) PCT Filed: Oct. 16, 2019

(86) PCT No.: PCT/CN2019/111505
§ 371 (c)(1),
(2) Date: Apr. 24, 2020

(87) PCT Pub. No.: WO2020/108143
PCT Pub. Date: Jun. 4, 2020

(65) Prior Publication Data
US 2021/0242244 A1    Aug. 5, 2021

(30) Foreign Application Priority Data
Nov. 28, 2018  (CN) .......................... 201821979286.2

(51) Int. Cl.
*H01L 27/12*   (2006.01)
*G02F 1/1362*  (2006.01)
*H01L 21/768*  (2006.01)

(52) U.S. Cl.
CPC ...... *H01L 27/124* (2013.01); *G02F 1/136263* (2021.01); *G02F 1/136272* (2021.01); *H01L 21/76894* (2013.01)

(58) Field of Classification Search
CPC ......... G02F 1/136263; G02F 1/136259; G02F 1/136272; H01L 27/124; H01L 27/3276
See application file for complete search history.

(56) References Cited

U.S. PATENT DOCUMENTS

| 7,372,514 B2 * | 5/2008 | Matsumoto ........... H01L 27/124 349/40 |
| 2009/0167976 A1 | 7/2009 | Chung et al. |
| 2015/0054165 A1 | 2/2015 | Won et al. |

(Continued)

FOREIGN PATENT DOCUMENTS

| CN | 101216643 A | 7/2008 |
| CN | 101644838 A | 2/2010 |
| CN | 103869513 A | 6/2014 |

(Continued)

*Primary Examiner* — Peter M Albrecht
(74) *Attorney, Agent, or Firm* — ArentFox Schiff LLP; Michael Fainberg

(57) ABSTRACT

An array substrate, a display panel, and a display device. The array substrate includes a substrate having a display region and a non-display region surrounding the display region. The display region includes a plurality of signal lines extending along a first direction. The non-display region includes at least three repair lead wires, and welding terminals connected to the repair lead wires in a one-to-one corresponding manner. The signal lines form overlapping regions together with an orthographic projection of at least one repair lead wire on the substrate.

11 Claims, 2 Drawing Sheets

(56) References Cited

U.S. PATENT DOCUMENTS

2017/0200409 A1  7/2017  Zhao et al.

FOREIGN PATENT DOCUMENTS

| CN | 105044948 | A |   | 11/2015 |
|----|-----------|---|---|---------|
| CN | 208937877 | U |   | 6/2019  |
| KR | 20000039467 | A | * | 7/2000 |
| KR | 20010005221 | A |   | 1/2001 |

* cited by examiner

ARRAY SUBSTRATE, DISPLAY PANEL AND DISPLAY DEVICE

CROSS REFERENCE TO RELATED APPLICATIONS

The present application is a National Stage of International Application No. PCT/CN2019/111505, filed on Oct. 16, 2019, which claims priority to China Patent Application No. 201821979286.2, filed on Nov. 28, 2018 in China Patent Office and entitled "Array Substrate, Display Panel and Display Device", both of which are hereby incorporated by reference in their entireties.

FIELD

The present application relates to the technical field of displaying, and particularly relates to an array substrate, a display panel, and a display device.

BACKGROUND

A thin film transistor liquid crystal display (TFT-LCD) has the advantages of small volume, low power consumption, no radiation, and the like, has occupied a dominant position in the current flat-panel display market, and is widely used in fields of desktop computers, notebook computers, personal digital assistants, mobile phones, televisions, monitors, and the like. For the TFT-LCD, a structure and a manufacturing process of an array substrate determine the product performance, yield and price of the TFT-LCD.

SUMMARY

An embodiment of the present application provides an array substrate, including a substrate having a display region and a non-display region surrounding the display region, where the display region includes a plurality of signal lines extending along a first direction; and the non-display region includes at least three repair lead wires, and welding terminals connected to the repair lead wires in a one-to-one corresponding manner; orthographic projections of the signal lines form overlapping regions together with an orthographic projection of at least one of repair lead wires on the substrate.

Optionally, during specific implementation, the repair lead wires respectively include portions extending along a second direction, and the second direction and the first direction are intersected; and the orthographic projections of the signal lines form overlapping regions together with an orthographic projection of the portion, extending along the second direction, of the repair lead wires on the substrate.

Optionally, during specific implementation, the repair lead wires respectively include a first sub repair wire and a plurality of second sub repair wires;

in each of the repair lead wires, the first sub repair wire is connected to the welding terminal correspondingly, and orthographic projections of the second sub repair wires form overlapping regions together with an orthographic projection of the first sub repair wire on the substrate, and the second sub repair wires respectively include a portion extending along the second direction; and in the above array substrate provided by the embodiment of the present application, the signal lines are divided into a plurality of groups, each group of signal lines are in lap joint with the portion, extending along the second direction, of at least one second sub repair wire in an insulating manner.

Optionally, during specific implementation, in the above array substrate provided by the embodiment of the present application, the orthographic projections of the second sub repair wires form overlapping regions together with an orthographic projection of a first sub repair wire of at least one of other repair lead wires on the substrate.

Optionally, during specific implementation, in the above array substrate provided by the embodiment of the present application, the orthographic projections of the second sub repair wires form overlapping regions together with orthographic projections of the first sub repair wires of all repair lead wires on the substrate.

Optionally, during specific implementation, in the above array substrate provided by the embodiment of the present application, at least one group of signal lines are in lap joint with at least two second sub repair wires in an insulating manner.

Optionally, during specific implementation, in the above array substrate provided by the embodiment of the present application, the second sub repair wires in lap joint with the same group of signal lines in an insulating manner are included in the same repair lead wire; or, the second sub repair wires in lap joint the same group of signal lines in an insulating manner are included in different repair lead wires.

Optionally, during specific implementation, in the above array substrate provided by the embodiment of the present application, the overlapping regions between the first sub repair wires and the second sub repair wires are in electrical connection or in lap joint in an insulating manner.

Optionally, during specific implementation, in the above array substrate provided by the embodiment of the present application, in response to that the overlapping regions between the first sub repair wires and the second sub repair wires are in electrical connection, the first sub repair wires and the second sub repair wires are located on a same film layer; and in response to that the overlapping regions between the first sub repair wires and the second sub repair wires are in lap joint in an insulating manner, the first sub repair wires and the second sub repair wires are located on different film layers.

Optionally, during specific implementation, in the above array substrate provided by the embodiment of the present application, the welding terminals and the first sub repair wires are located on a same film layer, and the second sub repair wires and the signal lines are located on different film layers.

Optionally, during specific implementation, in the above array substrate provided by the embodiment of the present application, each group of signal lines has a same quantity.

Optionally, during specific implementation, in the above array substrate provided by the embodiment of the present application, the signal lines include gate lines or data lines.

Correspondingly, an embodiment of the present application further provides a display panel, including the above array substrate provided by any one of the embodiments of the present application.

Correspondingly, an embodiment of the present invention further provides a display device, including the above display panel provided by the embodiment of the present application.

DETAILED DESCRIPTION OF THE EMBODIMENTS

Figure 1:
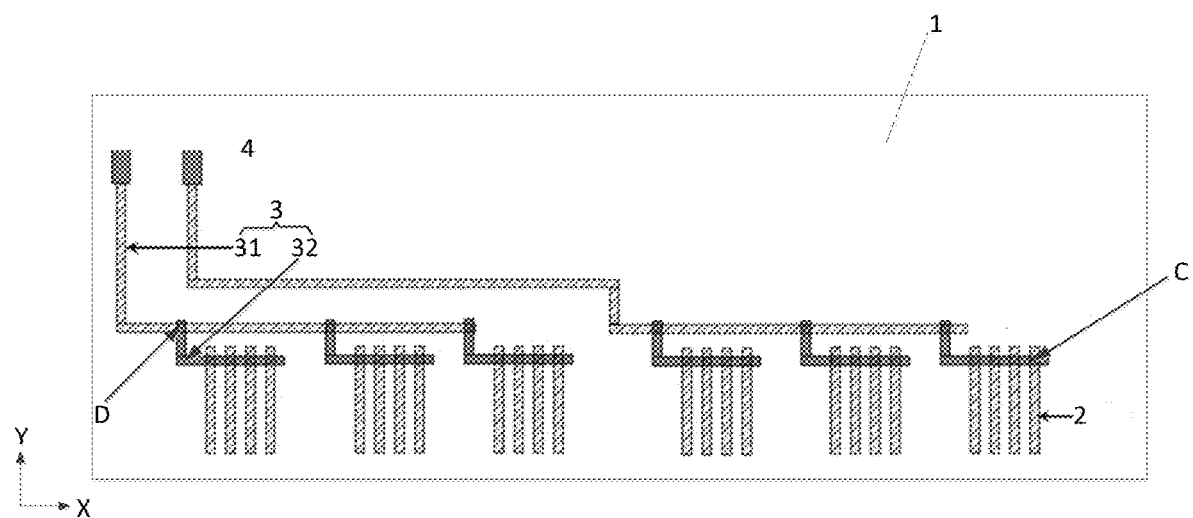
FIG. 1 is a structural schematic diagram of an array substrate provided by an embodiment of the present application.

In order to make objectives, technical solutions and advantages of the present application clearer, specific implementation modes of an array substrate, a display panel, and a display device, which are provided by the embodiments of the present application, are described in detail below in combination with accompanying drawings.

The thicknesses and shapes of various layers of films in the accompanying drawings do not reflect real scales, and are merely to illustrate the contents of the present application.

An array substrate provided by the embodiments of the present application, as shown in FIG. 1 to FIG. 4, includes a substrate 1 having a display region and a non-display region surrounding the display region. FIG. 1 to FIG. 4 only illustrate part of the display region and part of the non-display region. The display region includes a plurality of signal lines 2 extending along a first direction Y.

The non-display region includes at least three repair lead wires 3, and welding terminals 4 connected to the repair lead wires 3 in a one-to-one corresponding manner. The signal lines 2 form overlapping regions C together with an orthographic projection of at least one repair lead wire 3 on the substrate 1.

The array substrate provided by an embodiment of the present application includes a substrate having a display region and a non-display region surrounding the display region. The display region includes a plurality of signal lines. The non-display region includes at least three repair lead wires, and welding terminals connected to the repair lead wires in a one-to-one corresponding manner. The signal lines form overlapping regions together with an orthographic projection of at least one repair lead wire on the substrate. In the present application, by disposing the repair lead wires of which the orthographic projections on the substrate form overlapping regions together with the signal lines, when the signal lines are disconnected, the repair lead wires are fused by laser to connect the disconnected signal lines, without affecting the normal displaying of a display panel, to realize a repair function of the signal lines. Furthermore, by disposing at least three repair lead wires, the number of the repair signal lines can be increased, thereby increasing display yield.

During specific implementation, in the above array substrate provided by an embodiment of the present application, the repair lead wires 3 include portions extending along a second direction X. The second direction X and the first direction Y are intersected. Optionally, the signal lines 2 form overlapping regions together with orthographic projections of the portions, extending along the second direction X, of the repair lead wires 3 on the substrate.

In the array substrate provided by the embodiment of the present application, the signal lines 2 overlap with the portions, extending along the second direction X, of the repair lead wires 3, thereby being conductive to reducing lengths of the repair lead wires 3, reducing an occupied area of the repair lead wires 3, prolonging distances between the repair lead wires 3, and decreasing the probability of short circuiting, and facilitating the arrangement of the repair lead wires 3 greatly.

Optionally, the first direction Y and the second direction X may be perpendicular. As shown in FIG. 1 to FIG. 4, the first direction Y is perpendicular to a side edge of the substrate 1, and the second direction X is parallel to the edge. That is, the signal lines 2 are perpendicular to one edge of the substrate 1, and overlap with the portions, parallel to the edge, of the repair lead wires 3.

During specific implementation, in the above array substrate provided by the embodiment of the present application, the non-display regions in FIG. 1 to FIG. 4 are illustrated by taking two repair lead wires 3 partially extending along the second direction X as an example. However, in actual application, the non-display region of the array substrate provided by the embodiment of the present application includes at least three repair lead wires 3 partially extending along the second direction X. Other repair lead wires 3 have the same structures as the two repair lead wires 3 illustrated in FIG. 1 to FIG. 4, and also relations between the other repair lead wires 3 and the signal lines 2 are the same as relations between the two repair lead wires 3 and the signal lines 2, which is not repeatedly described herein.

During specific implementation, in the above array substrate provided by the embodiment of the present application, as shown in FIG. 1 to FIG. 4, the signal lines 2 are divided into a plurality of groups of signal lines.

Each repair lead wire 3 includes a first sub repair wire 31 and a plurality of second sub repair wires 32.

In the repair lead wires 3, the first sub repair wires 31 are connected to the welding terminals 4 in a one-to-one corresponding manner, and the first sub repair wires 31 and orthographic projections of the second sub repair wires 32 on the substrate 1 form overlapping regions D.

Each group of signal lines 2 are in lap joint with at least one second sub repair wire 32 in an insulating manner.

Figure 2:
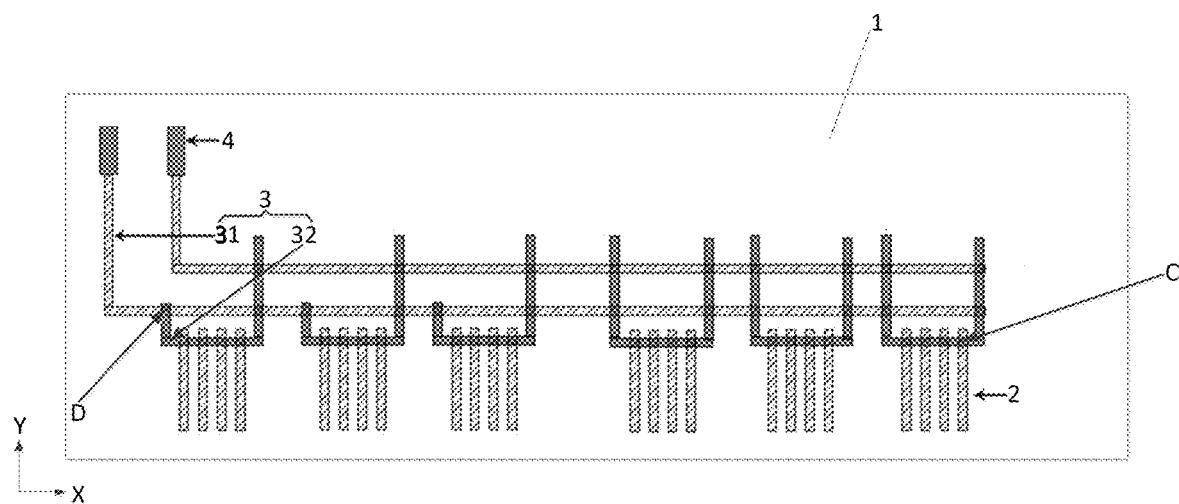
FIG. 2 is a structural schematic diagram of an array substrate provided by another embodiment of the present application.
Figure 3:
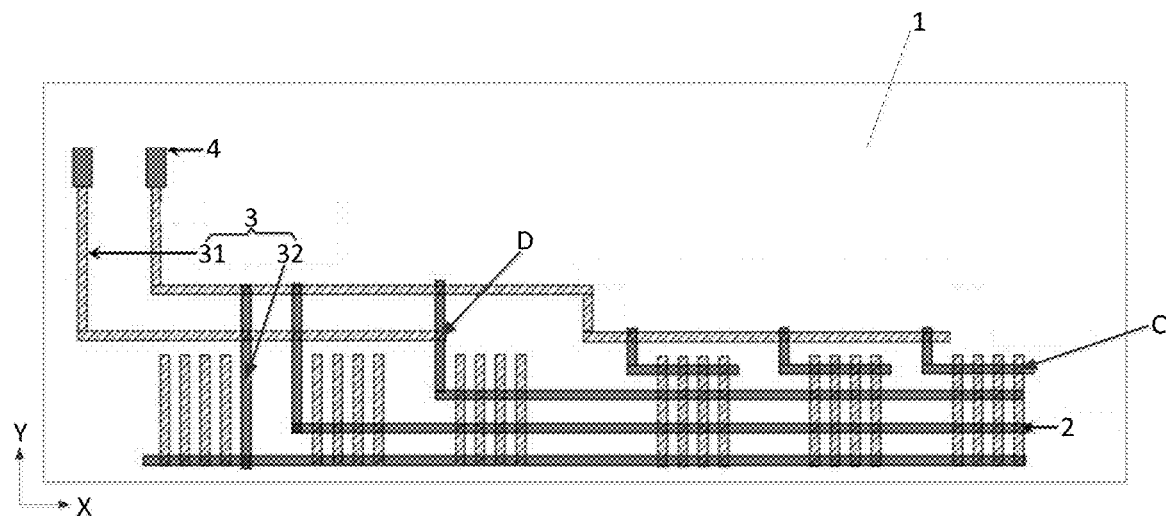
FIG. 3 is a structural schematic diagram of an array substrate provided by another embodiment of the present application.

During specific implementation, in the above array substrate provided by the embodiment of the present application, in FIG. 1 to FIG. 4, illustration is made by taking six groups of signal lines respectively including four signal lines as an example. Of course, during specific implementation, the signal lines on the array substrate may be divided into a plurality of groups, and the number of the signal lines in each group may be set according to an actual requirement. Optionally, as shown in FIG. 1 and FIG. 2, each group of signal lines 2 are only in lap joint with one second sub repair wire 32 in an insulating manner, and therefore, when a certain group of signal lines 2 are disconnected, the second repair wire 32 in lap joint with the certain group of signal lines 2 may be fused by laser to connect the disconnected signal lines 2, thus realizing a repair function of the signal lines 2. Since the signal lines 2 are in lap joint with the second sub repair wire 32 in an insulating manner, when the signal lines 2 are normal, the second sub repair wire 32 in lap joint with the signal lines in an insulating manner would not affect a normal display function of a display panel. As shown in FIG. 3, the various groups of signal lines 2 are in lap joint with the plurality of second sub repair wires 32 in an insulating manner, and therefore, if there are more disconnected positions in the signal lines 2, the plurality of second sub repair wires 32 may be fused by laser, and the disconnected positions are simultaneously repaired, or if there is one disconnected position in the signal lines 2, the disconnected position in the signal lines 2 may be repaired through the plurality of second sub repair wires 32, thus improving the repair yield of the signal lines 2.

Optionally, for example, the above array substrate provided by the embodiment of the present application may include 8 repair lead wires, each repair lead wire includes 15 second repair wires, and each second repair wire is in lap joint with 48 data lines. In this way, data lines of FHD1920 serial products may be ensured to be repaired.

It should be noted that lap joint in an insulating manner refers to realization of overlapping by disposing insulating layers between the signal lines and the second sub repair wires instead of electrical connection, i.e., only lap joint without contact is realized. Portions in lap joint in an insulating manner are fused by laser to realize the electrical connection only when the signal lines need to be repaired, and the lap joint in an insulating manner does not affect the normal display function when the signal lines do not need to be repaired.

During specific implementation, in the above array substrate provided by the embodiment of the present application, as shown in FIG. 1 to FIG. 3, the second sub repair wires 32 form overlapping regions D together with an orthographic projection of a first sub repair wire 31 of at least one of the other repair lead wires 3 on the substrate 1. The 'at least one of the other repair lead wires' refers to a repair lead wire except the repair lead wire to which the second sub repair wires belong. Optionally, as shown in FIG. 1, the second sub repair wires 32 form the overlapping regions D together with the orthographic projection of the first sub repair wire 31 of only one repair lead wire 3 on the substrate 1, and therefore, when the signal lines 2 are disconnected, the overlapping regions D between the second sub repair wires 32 and the first sub repair wire 31, and overlapping regions C between the second sub repair wires 32 and the signal lines are fused by laser to connect the disconnected signal lines 2, thus realizing the repair function of the signal lines 2. As shown in FIG. 2, the second sub repair wires 32 form the overlapping regions D together with the orthographic projections of the first sub repair wires 31 of the multiple repair lead wires 3 on the substrate 1, and therefore, when the signal lines 2 are disconnected, the disconnected signal lines 2 may be simultaneously repaired by using the first sub repair wires 31, thus improving the repair yield of the signal lines 2. Of course, during specific implementation, as shown in FIG. 3, part of the second sub repair wires 32 form the overlapping regions D together with the orthographic projections of the first sub repair wires 31 of the multiple repair lead wires 3 on the substrate 1, and part of the second sub repair wires 32 form the overlapping regions D together with the orthographic projection of the first sub repair wire 31 of only one repair lead wire 3 on the substrate 1, which is not limited herein.

During specific implementation, in the above array substrate provided by the embodiment of the present application, as shown in FIG. 2, the second sub repair wires 32 form the overlapping regions D together with the orthographic projections of the first sub repair wires 31 of the repair lead wires 3 on the substrate 1, and therefore, when the signal lines 2 are disconnected, the disconnected signal lines 2 may be simultaneously repaired by using the first sub repair wires 31, thus greatly improving the repair yield of the signal lines 2.

During specific implementation, in the above array substrate provided by the embodiment of the present application, as shown in FIG. 3, at least one group of signal lines 2 are in lap joint with at least two second sub repair wires 32 in an insulating manner, and therefore, when the signal lines in the above group of signal lines 2 are disconnected, the signal lines in the same group may be repaired through the at least two second sub repair wires 32 to further improve the repair yield of the signal lines 2.

Figure 4:
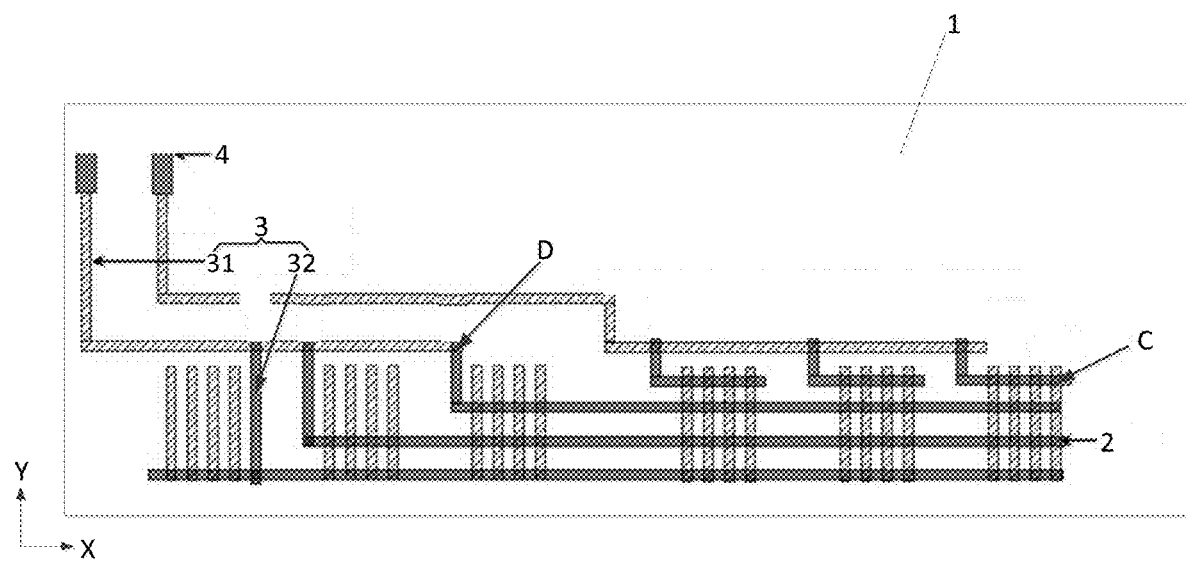
FIG. 4 is a structural schematic diagram of an array substrate provided by another embodiment of the present application.

During specific implementation, in the above array substrate provided by the embodiment of the present application, as shown in FIG. 4, the second sub repair wires 32 in lap joint with the same group of signal lines 2 in an insulating manner are included in the same repair lead wire 3; or, the second sub repair wires 32 in lap joint with the same group of signal lines 2 in an insulating manner are included in different repair lead wires 3. Optionally, as shown in FIG. 4, in the three groups of signal lines 2 on a left side, the second sub repair wires 32 in lap joint with the same group of signal lines 2 in an insulating manner are included in the same repair lead wire 3. In the three groups of signal lines 2 on a right side, the second sub repair wires 32 in lap joint with the same group of signal lines 2 in an insulating manner are included in different repair lead wires 3. For example, in the various groups of signal lines 2 on the right side, along the first direction Y, the topmost second sub repair wires 32 are included in the same repair lead wire 3, and the three lower second sub repair wires 32 are included in different repair lead wires 3.

During specific implementation, in the above array substrate provided by the embodiment of the present application, as shown in FIG. 3, at least part of the second sub repair wires 32 in lap joint with the same group of signal lines 2 in an insulating manner may form the overlapping regions D together with the orthographic projection of the first sub repair wire 31 of at least one of the other repair lead wires 3 on the substrate 1. The 'at least one of the other repair lead wires' refers to a repair lead wire except the repair lead wire to which the second sub repair wires belong. Of course, during specific implementation, the second sub repair wires 32 in lap joint with the same group of signal lines 2 in an insulating manner may form the overlapping regions D together with the orthographic projection of the first sub repair wire 31 of at least one of the other repair lead wires 3 on the substrate 1.

During specific implementation, in the above array substrate provided by the embodiment of the present application, as shown in FIGS. 1 to 4, the overlapping regions D between the first sub repair wires 31 and the second sub repair wires 32 may be in electrical connection or in lap joint in an insulating manner.

During specific implementation, in the above array substrate provided by the embodiment of the present application, as shown in FIGS. 1 to 4, when the overlapping regions D between the first sub repair wires 31 and the second sub repair wires 32 are in electrical connection, the first sub repair wires 31 and the second sub repair wires 32 may be located on a same film layer, and therefore, the first sub repair wires 31 and the second sub repair wires 32 may be prepared through a primary composition process. When the overlapping regions D between the first sub repair wires 31 and the second sub repair wires 32 are in lap joint in an insulating manner, the first sub repair wires 31 and the second sub repair wires 32 may be located on different film layers.

During specific implementation, in the above array substrate provided by the embodiment of the present application, as shown in FIGS. 1 to 4, the welding terminals 4 and the first sub repair wires 31 are located on a same film layer, and therefore, the welding terminals 4 and the first sub repair wires 31 may be prepared through the primary composition process. The second sub repair wires 32 and the signal lines 2 are located on different film layers, and optionally, insulating layers are arranged between the second sub repair wires 32 and the signal lines 2.

During specific implementation, in the above array substrate provided by the embodiment of the present application, as shown in FIGS. 1 to 4, in order to unify manufacturing processes, the number of the signal lines 2 in each group is the same. Of course, the number of the signal lines 2 in each group may also be different, which is not limited herein.

During specific implementation, in the above array substrate provided by the embodiment of the present application, the signal lines may include gate lines or data lines. As shown in FIGS. 1 to 4, the embodiment of the present application is described by taking the data lines as an example, and of course, the gate lines may also be taken as an example. A repair principle of the gate lines is the same as a repair principle of the data lines, which is not repeatedly described herein.

Based on the same inventive concept, an embodiment of the present application further provides a display panel, including the above array substrate provided by any one of the embodiments of the present application. The principle of the display panel for solving problems is similar to that of the above array substrate, so that the implementation of the display panel may refer to the implementation of the above array substrate, and repeated parts will not be described herein.

Based on the same inventive concept, an embodiment of the present application further provides a display device, including the above display panel provided by the embodiment of the present application. The principle of the display device for solving problems is similar to that of the above display panel, so that the implementation of the display device may refer to the implementation of the above display panel, and repeated parts will not be described herein.

According to the array substrate, the display panel and the display device which are provided by the embodiments of the present application, the array substrate includes the substrate having the display region and the non-display region surrounding the display region. The display region includes the plurality of signal lines extending along the first direction. The non-display region includes the at least three repair lead wires, and the welding terminals connected to the repair lead wires in a one-to-one corresponding manner. The signal lines form the overlapping region together with the orthographic projection of at least one repair lead wire on the substrate. In the present application, by disposing the repair lead wires of which the orthographic projections on the substrate form the overlapping regions together with the signal lines, when the signal lines are disconnected, the repair lead wires are fused by laser to connect the disconnected signal lines, without affecting the normal displaying of the display panel to realize a repair function of the signal lines. Furthermore, by disposing the at least three repair lead wires in the present application, the number of repaired signal lines can be increased, thereby increasing display yield.

Obviously, those skilled in the art can make various changes and modifications to the present application without departing from the spirit and scope of the present application.

The invention claimed is:

1. An array substrate, comprising a substrate having a display region and a non-display region surrounding the display region, wherein the display region comprises a plurality of signal lines extending along a first direction; the non-display region comprises at least three repair lead wires, and welding terminals connected to the repair lead wires in a one-to-one corresponding manner; and orthographic projections of the signal lines form overlapping regions together with an orthographic projection of at least one of the repair lead wires on the substrate;

wherein the repair lead wires respectively comprise a first sub repair wire and a plurality of second sub repair wires;

in each of the repair lead wires, the first sub repair wire is connected to the welding terminal correspondingly, and orthographic projections of the second sub repair wires form overlapping regions together with an orthographic projection of the first sub repair wire on the substrate, and the second sub repair wires respectively comprise a portion extending along a second direction;

the signal lines are divided into a plurality of groups; a first part of the second sub repair wires in lap joint with a same group of signal lines within some of the plurality of groups in an insulating manner are included in a same repair lead wire, and a second part of the second sub repair wires in lap joint with a same group of signal lines within other of the plurality of groups in an insulating manner are included in different repair lead wires.

2. The array substrate according to claim 1, wherein the second direction and the first direction are intersected; and the orthographic projections of the signal lines form the overlapping regions together with an orthographic projection of the portion, extending along the second direction, of the second sub repair wires on the substrate.

3. The array substrate according to claim 1, wherein orthographic projections of the second sub repair wires form overlapping regions together with an orthographic projection of a first sub repair wire of at least one of other repair lead wires on the substrate.

4. The array substrate according to claim 3, wherein the orthographic projections of the second sub repair wires form overlapping regions together with orthographic projections of first sub repair wires of all repair lead wires on the substrate.

5. The array substrate according to claim 1, wherein the overlapping regions between the first sub repair wires and the second sub repair wires are in electrical connection or in lap joint in an insulating manner.

6. The array substrate according to claim 5, wherein in response to that the overlapping regions between the first sub repair wires and the second sub repair wires are in electrical connection, the first sub repair wires and the second sub repair wires are located on a same film layer; and in response to that the overlapping regions between the first sub repair wires and the second sub repair wires are in lap joint in an insulating manner, the first sub repair wires and the second sub repair wires are located on different film layers.

7. The array substrate according to claim 1, wherein the welding terminals and the first sub repair wires are located on a same film layer, and the second sub repair wires and the signal lines are located on different film layers.

8. The array substrate according to claim 1, wherein each group of signal lines has a same quantity.

9. The array substrate according to claim 1, wherein the signal lines comprise gate lines or data lines.

10. A display panel, comprising the array substrate according to claim 1.

11. A display device, comprising the display panel according to claim 10.

\* \* \* \* \*